United States Patent
Lee

(10) Patent No.: US 6,353,551 B1
(45) Date of Patent: Mar. 5, 2002

(54) STATIC RANDOM ACCESS MEMORY CIRCUITS

(75) Inventor: Andy Lee, San Jose, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 09/443,940

(22) Filed: Nov. 19, 1999

Related U.S. Application Data

(63) Continuation of application No. 09/038,123, filed on Mar. 11, 1998, now Pat. No. 6,128,215.
(60) Provisional application No. 60/056,165, filed on Aug. 19, 1997.

(51) Int. Cl.[7] .............................................. G11C 11/00
(52) U.S. Cl. .................... 365/154; 365/205; 365/189.08
(58) Field of Search ................................. 365/154, 205, 365/239, 189.04, 189.08, 189.11, 230.03, 104

(56) References Cited

U.S. PATENT DOCUMENTS

| | | | |
|---|---|---|---|
| 4,642,487 A | 2/1987 | Carter | 307/465 |
| 4,706,216 A | 11/1987 | Carter | 365/94 |
| 4,758,985 A | 7/1988 | Carter | 365/94 |
| 4,777,623 A | 10/1988 | Shimazu et al. | 365/154 |
| 4,870,302 A | 9/1989 | Freeman | 307/465 |
| 4,928,266 A | 5/1990 | Abbott et al. | 365/189.01 |
| 5,089,993 A | 2/1992 | Neal et al. | 365/63 |
| 5,128,559 A | 7/1992 | Steele | 307/465 |
| 5,212,663 A | 5/1993 | Leong | 365/189.01 |
| RE34,363 E | 8/1993 | Freeman | 307/465 |
| 5,237,219 A | 8/1993 | Cliff | 307/465 |
| 5,258,668 A | 11/1993 | Cliff et al. | 307/465 |
| 5,260,610 A | 11/1993 | Pedersen et al. | 307/465 |
| 5,325,325 A | 6/1994 | Azuma | 365/156 |
| 5,361,232 A | 11/1994 | Petschauer et al. | 365/201 |
| 5,394,104 A | 2/1995 | Lee | 327/143 |
| 5,430,687 A * | 7/1995 | Hung et al. | 365/230.08 |
| 5,450,022 A | 9/1995 | New | 326/39 |

(List continued on next page.)

FOREIGN PATENT DOCUMENTS

| | | | |
|---|---|---|---|
| EP | 0 430 101 A2 | 6/1991 | G11C/7/00 |
| GB | 2281427 | 3/1995 | H03K/19/173 |

OTHER PUBLICATIONS

John L. Nichols, "A Logical Next Step for Read–Only Memories", Electronics, Jun. 12, 1967, pp. 111–113.

Floyd Kvamme, "Standard Read–Only Memories Simplify Complex Logic Design", Electronics, Jan. 5, 1970, pp. 88–95.

Albert Hemel, "Making Small ROM's [sic] Do Math Quickly, Cheaply and Easily", Electronics, May 11, 1970, pp. 104–111.

(List continued on next page.)

*Primary Examiner*—David Nelms
*Assistant Examiner*—Thong Le
(74) *Attorney, Agent, or Firm*—Fish & Neave; Robert R. Jackson; Joo-Youn Park

(57) ABSTRACT

A static random access memory ("SRAM") that is especially suitable for such uses as inclusion on a programmable logic device to provide programmable control of the configuration of that device. The SRAM includes a plurality of SRAM cells, all of which are simultaneously cleared to a first of two logic states by application of a second of the two logic states to clear terminals of the cells. Any cell that needs to be programmed to the second of the two logic states is thereafter specifically addressed and a data signal thereby applied which programs the cell to the second logic state. The cells are preferably constructed so that they are programmed to the second logic state by application of a data signal having the first logic state. Even a very small unipolar MOS pass gate transistor can therefore be used as the addressable path through which the data signal is applied. The memory may also include circuitry for verifying the contents of each cell via the data input terminal of the cell.

38 Claims, 7 Drawing Sheets

U.S. PATENT DOCUMENTS

| | | | | |
|---|---|---|---|---|
| 5,450,353 A | | 9/1995 | Koike | 365/154 |
| 5,469,400 A | | 11/1995 | Yamano | 365/230.01 |
| 5,689,195 A | | 11/1997 | Cliff et al. | 326/41 |
| 5,898,318 A | * | 4/1999 | Pederson | 326/39 |
| 6,020,759 A | * | 2/2000 | Heile | 326/40 |
| 6,128,215 A | * | 10/2000 | Lee | 365/154 |

OTHER PUBLICATIONS

William I. Fletcher et al., "Simplify Sequential Circuit Designs", Electronic Design, Jul. 8, 1971, pp. 70–72.

S. C. Hu, "Cellular Synthesis of Synchronous Sequential Machines", IEEE Transactions on Computers, Dec. 1972, pp. 1399–1405.

E. W. Page, "Programmable Array Realizations of Sequential Machines," Department of Electrical Engineering, Duke University, Doctoral Dissertation, 1973.

Howard A. Sholl et al., "Design of Asynchronous Sequential Networks Using Read–Only Memories", IEEE Transactions on Computers, vol. C–24, No. 2, Feb. 1975, pp. 195–206.

Arnold Weinberger, "High–Speed Programmable Logic Array Adders", IBM J. Res. Develop., vol. 23, No. 2, Mar. 1979, pp. 163–178.

Yahiko Kambayashi, "Logic Design of Programmable Logic Arrays", IEEE Transactions on Computers, vol. C–28, No. 9, Sep. 1979, pp. 609–117.

David A. Hodges et al., *Analysis and Design of Digital Integrated Circuits*, Second Edition, McGraw–Hill Publishing Company, New York, 1998, pp. 364–369.

"Optimized Reconfigurable Cell Array (ORCA) Series Field–Programmable Gate Arrays," Advanced Data Sheet, Feb. 1993, AT&T Microelectronics, pp. 1–87.

*The Programmable Logic Data Book*, Xilinx, Inc. 1994, pp. 2–5 through 2–102.

\* cited by examiner

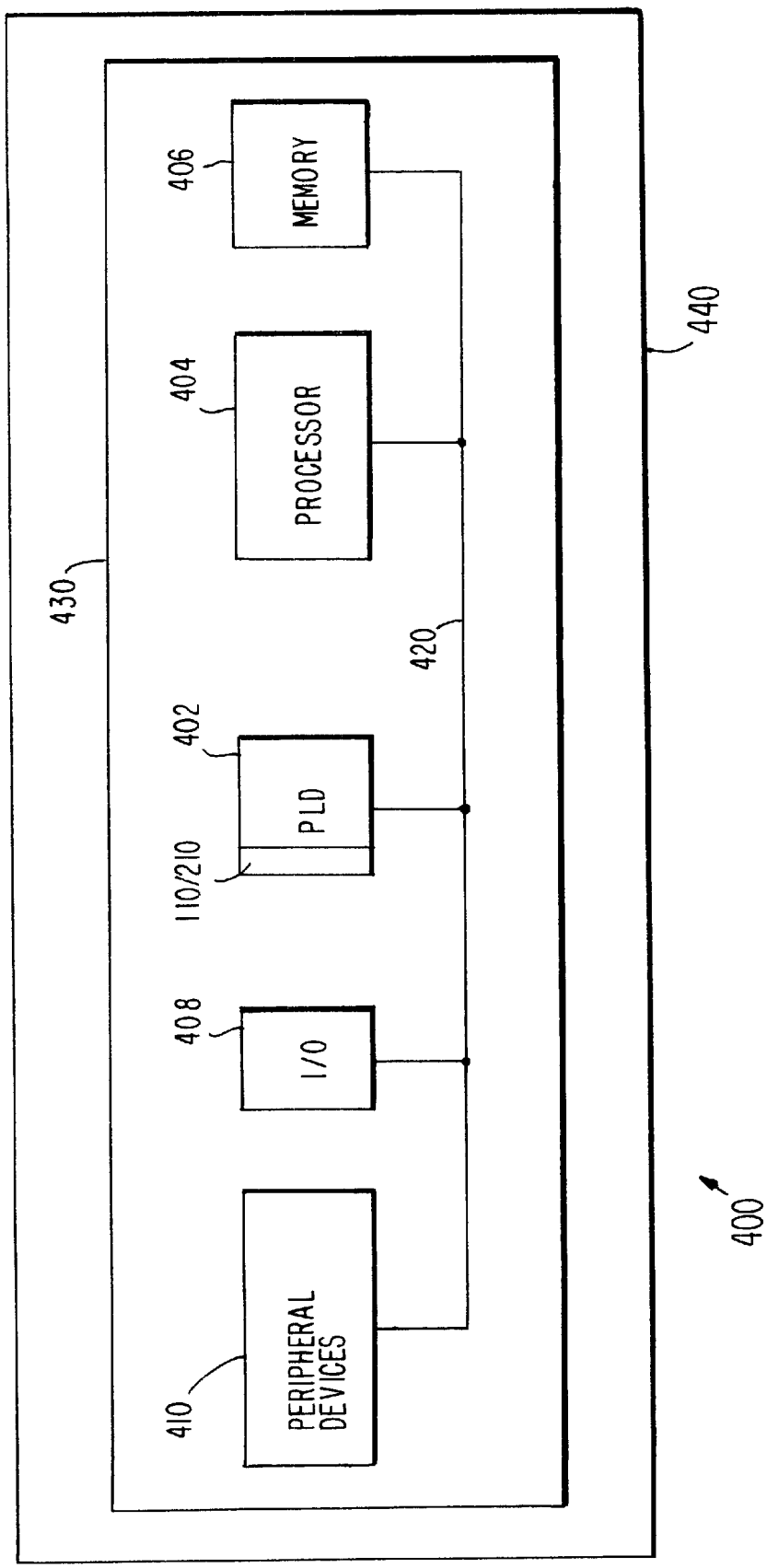

STATIC RANDOM ACCESS MEMORY CIRCUITS

CROSS REFERENCE TO RELATED APPLICATIONS

This application claims the benefit of U.S. provisional application No. 60/056,165, filed Aug. 19, 1997. This application is also a continuation of application No. 09/038,123, filed Mar. 11, 1998, now U.S. Pat. No. 6,128,215, which is hereby incorporated by reference in its entirety.

BACKGROUND OF THE INVENTION

This invention relates to static random access memory circuits, and more particularly to static random access memory circuits that are especially suitable for such purposes as inclusion on programmable logic integrated circuit devices for programmable control of the configuration of those devices.

One example of a known programmable logic device 500 is shown in FIG. 1. Device 500 may be generally like the programmable logic devices shown and described in Cliff et al. U.S. Pat. No. 5,689,195, which is hereby incorporated by reference herein. Device 500 includes a plurality of regions 510 of programmable logic disposed on the device in a two-dimensional array of intersecting rows and columns of such regions. Each region includes a plurality of subregions 512 of programmable logic. For example, each subregion 512 may include a four-input look-up table which is programmable to produce a "combinatorial" output signal which can be any logical combination of four input signals applied to the look-up table. Each subregion 512 may additionally include a register (e.g., a flip-flop) for selectively registering (storing) the combinatorial output signal to produce a registered output signal. And each subregion 512 may include programmable logic connectors ("PLCs") for programmably selecting either the combinatorial or registered output signal as the final output signal of the subregion.

A plurality of horizontal interconnection conductors 520 is associated with each row of regions 510 for conveying signals to, from, and/or between the regions in the associated row. A plurality of vertical interconnection conductors 530 is associated with each column of regions 510 for conveying signals to, from, and/or between the various rows. A plurality of local conductors 540 is associated with each region 510 for making selected signals on the adjacent horizontal conductors 520 available to the associated region. PLCs 522 are provided for making programmable connections between selected intersecting conductors 520 and 540. A plurality of subregion feeding conductors 550 is associated with each subregion 512 for applying selected signals on the adjacent conductors 540 (and adjacent local feedback conductors 560 (described below)) to the associated subregion. PLCs 542 are provided for making programmable connections between intersecting conductors 540/560 and 550. The output signal of each subregion 512 can be applied to selected adjacent vertical conductors via PLCs 562 and/or to selected horizontal conductors 520 via PLCs 564. The output signal of each subregion 512 is also made available as a local feedback signal (via a conductor 560) to all of the subregions in the region 510 that includes that subregion. Selected intersecting horizontal and vertical conductors are programmably interconnectable by PLCs 532.

Another example of a known programmable logic device 600 is shown in FIG. 2. Device 600 may be generally like the programmable logic devices shown in Freeman U.S. Pat. No. Re. 34,363, which is also hereby incorporated by reference herein. Device 600 includes a plurality of configurable logic blocks ("CLBs") 610 disposed on the device in a two-dimensional array of intersecting rows and columns of CLBs. Each CLB 610 may include one or two small, programmable, look-up tables and other circuitry such as a register and PLCs for routing signals within the CLB. A plurality of horizontal interconnection conductor tracks 620 are disposed above and below each row of CLBs 610. A plurality of vertical interconnection conductor tracks 630 are disposed to the left and right of each column of CLBs 610. Local conductors 640 are provided for bringing signals into each CLB 610 from selected conductor tracks 620/630 adjacent to each side of the CLB and/or for applying signals from the CLB to selected adjacent conductor tracks 620/630. PLCs 622/632 are provided for making programmable connections between selected intersecting conductors 620/630 and 640. PLCs 624 are provided for making programmable connections between selected conductors segments in tracks 620 and/or 630 that intersect or otherwise come together at the locations of those PLCs.

In programmable logic devices such as those shown in FIGS. 1 and 2, first-in/first-out ("FIFO") chains of static random access memory ("SRAM") cells are commonly used on the device for programmable control of the configuration of the device. For example, the SRAM cells in such FIFO chains may be used to control the logic performed by each subregion 512 or CLB 610 (e.g., by constituting or controlling the data stored in the look-up tables in those components and by controlling the connections made by the PLCs in those components). The SRAM cells in the FIFO chains may also be used to control the connections made by the various interconnection conductor PLCs (e.g., PLCs 522, 532, 542, 562, 564, 622, 624, and 632) on the device. A typical prior art FIFO SRAM chain 10 will now be described with reference to FIG. 3.

In the FIFO SRAM chain 10 shown in FIG. 3, each SRAM cell 20 includes a relatively strong, forwardly directed inverter 22 connected in a closed loop series with a relatively weak, backwardly directed inverter 24. In the absence of a signal passed from above by an NMOS pass gate 14, each inverter 24 is strong enough to hold the associated inverter 22 in whatever state it was left by the most recent signal passed by the pass gate 14 immediately above. On the other hand, each inverter 24 is not strong enough to prevent the associated inverter 22 from responding to any signal passed by the pass gate 14 immediately above.

Programming data is applied to FIFO chain 10 via DATA IN lead 12 at the start of the chain. Initially all of pass gates 14 are enabled by address signals ADDR-1 through ADDR-N. This allows the first programming data bit to pass all the way down the chain (inverted by each successive inverter 22 that it passes through) until it reaches and is stored in cell 20-N. Pass gate 14-N is then turned off by changing the ADDR-N signal to logic 0. The next programming data bit from lead 12 therefore passes down the chain until it reaches and is stored in the cell immediately above cell 20-N (not shown but similar to all other cells 20). The NMOS pass gate 14 above the cell above cell 20-N is then turned off and the next programming data bit is applied to lead 12. This process continues until all of cells 20 have been programmed and all of pass gates 14 have been turned off. Each cell 20 outputs the data it stores via its DATA OUT lead. These DATA OUT signals may be used to control various aspects of the operation of a programmable logic device that includes chain 10. For example, a DATA OUT signal from chain 10 may control a programmable aspect of the "architecture" of the programmable logic device (e.g., which of several available clock or clear signals a register in a subregion 512 (FIG. 1) or a CLB 610 (FIG. 2) responds to). Or a DATA OUT signal from chain 10 may control a programmable aspect of the logic performed by the device (e.g., by being a datum in a look-up table in a subregion 512 or a CLB 610). As still another example, a DATA OUT signal from chain 10 may control an interconnection conductor PLC (e.g., a PLC 522, 532, etc. (FIG. 1), or a PLC 622, 624, etc. (FIG. 2)) on the device.

The contents of chain 10 may be verified by using the ADDR signals to enable pass gates 14 progressively from the bottom up. This allows the data in cells 20 to be read out one after another from the bottom up via VERIFY lead 16.

It will be apparent from the foregoing that in order to program or verify chain 10 each NMOS pass gate 14 must be able to effectively pass both logic 0 and logic 1 signals. When circuit components are made very small (as is becoming possible as a result of on-going advances in the techniques for semiconductor fabrication) and VCC (the power voltage used for logic 1 signals) is accordingly reduced, an NMOS pass gate 14 may not be able to pass a logic 1 signal that is sufficiently strong to overwrite the logic 0 output of the inverter 24 below it unless the pass gate is made undesirably large. Any unipolar MOS (i.e., NMOS or PMOS) pass gate will have this or a similar problem in these circumstances. Thus a PMOS pass gate does not pass logic 0 very well under the above-described conditions that reduce the effectiveness of an NMOS pass gate in passing logic 1. FIFO SRAM chains are therefore becoming less satisfactory for use as the programmable elements in products such as programmable logic devices.

In view of the foregoing, it is an object of this invention to provide improved SRAMs for use on programmable logic devices or in other similar contexts.

It is a more particular object of this invention to provide SRAMs that can be used on programmable logic devices that are made using advanced integrated circuit fabrication techniques and therefore with extremely small circuit components and/or with the intention of using relatively low VCC potential.

SUMMARY OF THE INVENTION

These and other objects of the invention are accomplished in accordance with the principles of the invention by providing an SRAM made up of SRAM cells, all of which store a first of two logic states when the SRAM is initialized, and which are individually or specifically addressed during programming mode when it is desired to change the state of an addressed cell to the second of the two logic states. In addition, the address connection of each cell is such that the cell is changed to the second logic state by passing a logic 0 signal through an NMOS pass gate to the cell, or by passing a logic 1 signal through a PMOS pass gate to the cell. Even NMOS pass gates that are too small to reliably pass logic 1 signals pass logic 0 signals perfectly satisfactorily. Similarly, even PMOS pass gates that are too small to reliably pass logic 0 signals pass logic 1 signals satisfactorily.

The data input terminal of each SRAM cell can also be used to verify the contents of the cell after programming. To verify a cell's contents, a lead that is used to supply data to the cells during programming is charged to the second logic state and then weakly held at that potential. The cell to be verified is then addressed to connect the data input terminal of the cell to the above-mentioned data input lead. If the cell has the first logic state, the cell will not try to discharge the data input lead, which will therefore remain at the second logic potential. On the other hand, if the cell is at the second logic potential, the cell will gradually discharge the data input lead to the first logic potential (although the cell itself will not change from the second logic state to the first logic state). Thus the potential on the data input lead after the foregoing operations can be used to verify the contents of the SRAM cell being tested.

Further features of the invention, its nature and various advantages will be more apparent from the accompanying drawings and the following detailed description of the preferred embodiments.

BRIEF DESCRIPTION OF THE DRAWINGS

FIG. 7 is a simplified block diagram of an illustrative embodiment of a system which includes a programmable logic device configured by an SRAM of this invention, all in accordance with the invention.

DETAILED DESCRIPTION OF THE PREFERRED EMBODIMENTS

Figure 3:
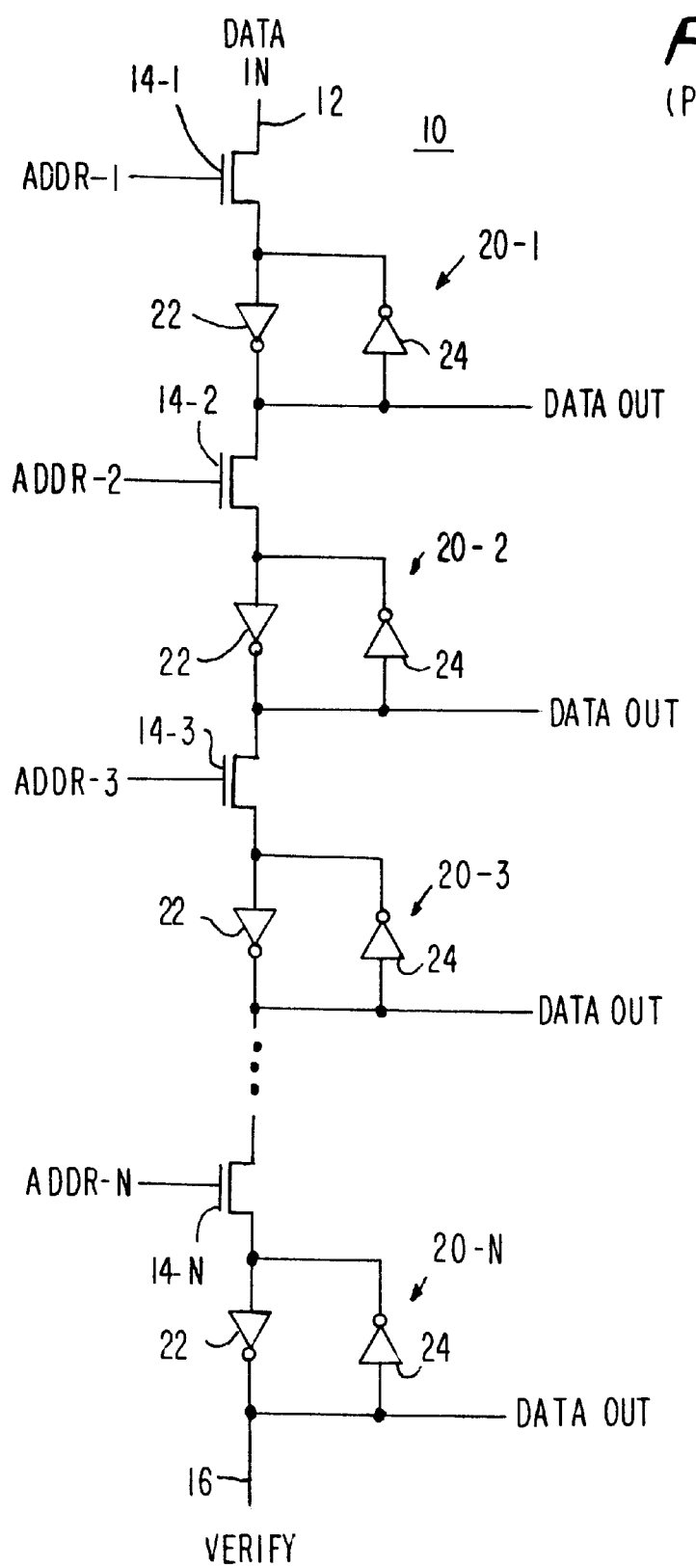
FIG. 3 is a simplified schematic diagram of a conventional FIFO SRAM chain.
Figure 4:
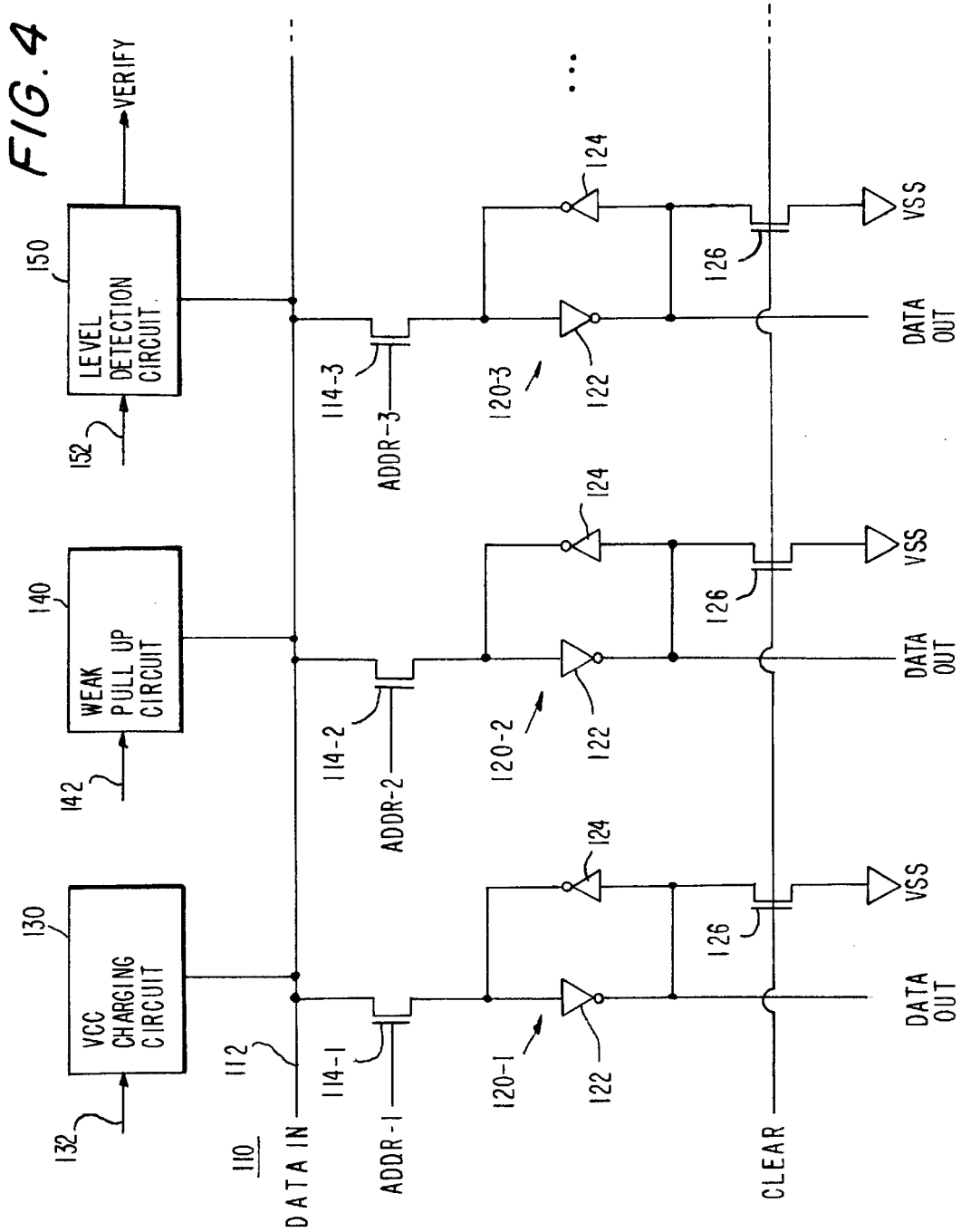
FIG. 4 is a simplified schematic block diagram of representative portions of an illustrative embodiment of an SRAM constructed in accordance with this invention.
Figure 5:
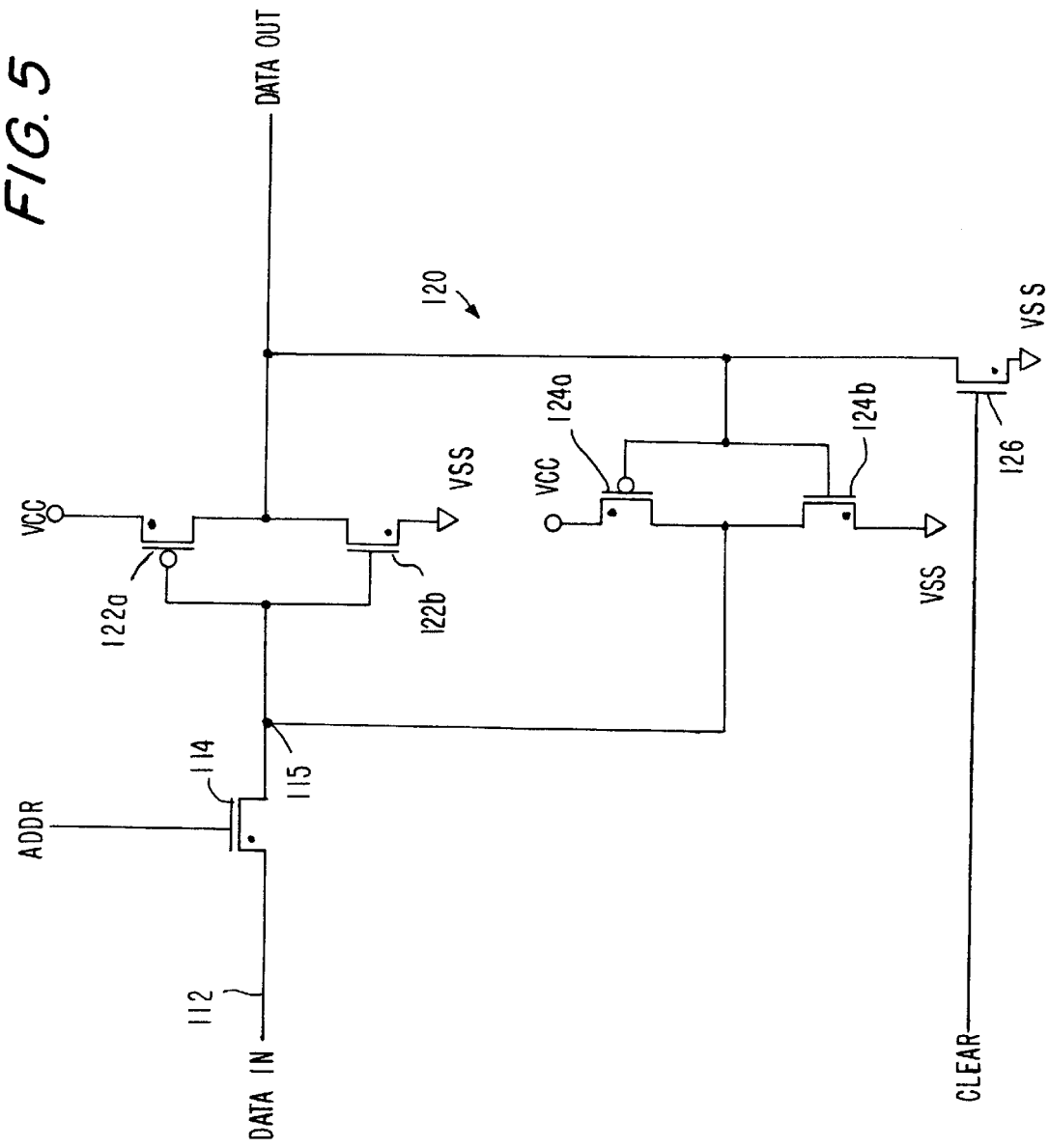
FIG. 5 is a more detailed schematic diagram of an illustrative embodiment of a representative portion of the circuitry shown in FIG. 4.

A representative portion of an illustrative embodiment of SRAM circuitry 110 in accordance with this invention is shown in FIG. 4. SRAM circuitry 110 includes any desired number of SRAM cells 120, each of which is selectively connectable to a common DATA IN lead 112 via a respective NMOS pass-gate 114. Each SRAM cell 120 includes a relatively strong inverter 122 connected in a closed loop series with a relatively weak inverter 124. A more detailed circuit diagram of a representative SRAM cell 120 is shown in FIG. 5 and described later in this specification. The output terminal of each SRAM cell's strong inverter 122 is the DATA OUT lead of that cell. Assuming that SRAM circuitry 110 is included on a programmable logic device, the DATA OUT signals of that circuitry can be used in any way that the DATA OUT signals in FIG. 3 can be used to programmably control various aspects of the connectivity and operation (generically the "configuration") of the programmable logic (e.g., as described above in connection with FIGS. 1–3 for the illustrative programmable logic device organizations shown in FIGS. 1 and 2). The DATA OUT terminal of each SRAM cell is also selectively connectable to VSS (logic 0 (ground)) via an associated NMOS pass gate 126. All of gates 126 are enabled in parallel by a logic 1 signal applied to the CLEAR lead. VCC charging circuit 130, week pull up circuit 140, and level detection circuit 150 are used only during operation of the circuitry to verify the contents of SRAM cells 120. These circuit components are therefore initially inoperative and have no effect on the circuitry.

To program memory circuitry 110 all of pass gates 114 are disabled by logic 0 address signals ADDR-1, ADDR-2, etc. All cells 120 are then cleared by causing the CLEAR signal to go to logic 1. This enables all of pass gates 126, thereby applying logic 0 to the input terminal of the inverter 124 in each cell 120. The resulting logic 1 output of each inverter 124 causes the output of the associated inverter 122 to become logic 0, thereby holding the DATA OUT signal of each cell 120 at logic 0 even after the CLEAR signal returns to logic 0.

After all of cells 120 have been cleared to logic 0 as described above, elements 112 and 114 are used to write logic 1 into only those cells that need to be programmed to logic 1. Logic 0 is applied to DATA IN lead 112. Then logic 1 is applied (sequentially or simultaneously as desired) to the ADDR leads of the pass gates 114 of only those cells 120 that need to be switched from logic 0 to logic 1. Enabling the pass gate 114 of a cell in this way causes the logic 0 signal on DATA IN lead 112 to be applied to the input terminal of that cell's inverter 122. This causes the output terminal of that inverter (and therefore the DATA OUT signal of that cell) to switch to logic 1. The associated inverter 124 operates to hold that inverter 122 in the logic 1 output condition even after the associated ADDR signal switches back to logic 0, thereby disconnecting the memory cell from DATA IN lead 112. This completes the process of programming cells 120.

In actual practice in which the circuitry shown in FIG. 4 is repeated a number of times but with the ADDR signals shared by all the repetitions, it may be necessary, when enabling a particular address line as described above, to apply logic 1 to the DATA IN leads 112 of any repetitions in which the addressed SRAM cells 120 are not to be programmed logic 1. This will prevent inadvertent switching from logic 0 to logic 1 of SRAM cells 120 that are not to be so switched. Structures including repetitions of the FIG. 4 circuitry are discussed in more detail below.

From the foregoing it will seen that all cells 120 are initially cleared to logic 0. Then only those cells requiring programming to logic 1 are addressed and overwritten with logic 1. To do this overwriting, the NMOS pass gates of the cells to be overwritten are only required to pass logic 0, which they do very well even when they are made very small. The circuitry also operates very well with relatively low VCC (logic 1 (power)) voltage or potential, since pass gates 114 are not required to pass logic 1 in order to program cells 120.

After cells 120 have been programmed as described above, their contents can be verified as will now be described. DATA IN lead 112 is first isolated from other signal sources such as the data signal source. VCC charging circuit 130 is then turned on via its control lead 132 to charge lead 112 to logic 1. Circuit 130 is then turned off and weak pull up circuit 140 is turned on via its control lead 142 to apply a weak pull up (logic 1) signal to lead 112. A logic 1 signal is then applied to the ADDR lead of the memory cell 120 whose content is to be verified. This turns on the associated NMOS pass gate 114. If the cell 120 being verified is storing logic 0, the output of that cell's inverter 124 will be logic 1 and there will be no tendency of the voltage on lead 112 to drop from logic 1. On the other hand, if the cell 120 being verified is storing logic 1, the output signal of that cell's inverter 124 will be logic 0, which will cause the voltage on lead 112 to gradually fall from logic 1 toward logic 0. (Under these conditions, the logic 1 signal from lead 112 is not strong enough to change the state of the cell 120 being verified.) Level detection circuit 150 is turned on via its control lead 152 a suitable time interval after the transistor 114 of the cell being verified is turned on. If the voltage on lead 112 is still logic 1, circuit 150 produces a VERIFY output signal which indicates that the cell being verified is storing logic 0. On the other hand, if the voltage on lead 112 has fallen to logic 0 (or sufficiently far toward logic 0), circuit 150 produces a VERIFY output signal which indicates that the cell being verified is storing logic 1.

The foregoing verification steps are repeated for each cell 120 along line 112 to be verified.

It will be noted that the above-described verification process is not destructive of the data stored in cells 120.

A programmable logic device will typically include several repetitions of the FIG. 4 circuitry (i.e., several parallel DATA IN leads 112 and associated circuitry). The ADDR-1, ADDR-2, etc., signals will be shared by all of these parallel SRAM strings. In particular, one SRAM cell 120-1 in each string will be controlled by a common ADDR-1 signal, another one SRAM cell 120-2 in each string will be controlled by a common ADDR-2 signal, and so on. Thus (as has already been mentioned) when it is desired to program the SRAM cells controlled by any particular address signal, it may be necessary to apply logic 1 to some DATA IN lines 112 to prevent the associated SRAM cells from inadvertently switching from their initial logic 0 output condition.

An illustrative embodiment of a representative SRAM cell 120 is shown in more detail in FIG. 5. Relatively strong inverter 122 is made up of P-channel transistor 122a and N-channel transistor 122b. Relatively weak inverter 124 is made up of P-channel transistor 124a and N-channel transistor 124b. In order for clear pass gate 126 to reset cell 120 to logic 0 as described above, the conductance of transistor 126 should be greater than the conductance of transistor 122a. In order for a logic 0 data signal on lead 112 to cause cell 120 to switch from a reset logic 0 data output to a logic 1 data output as described above, the conductance of transistor 114 should be greater than the conductance of transistor 124a. In order to use lead 112 to verify the contents of cell 120 as described above, the conductance of transistor 124b should be greater than the conductance of transistor 114. This conductance relationship can be satisfied by making transistors 124b and 114 the same size because lower Vgs and body effect decreases the conductance of transistor 114 as the data input terminal 115 of cell 120 begins to rise in voltage.

Figure 6:
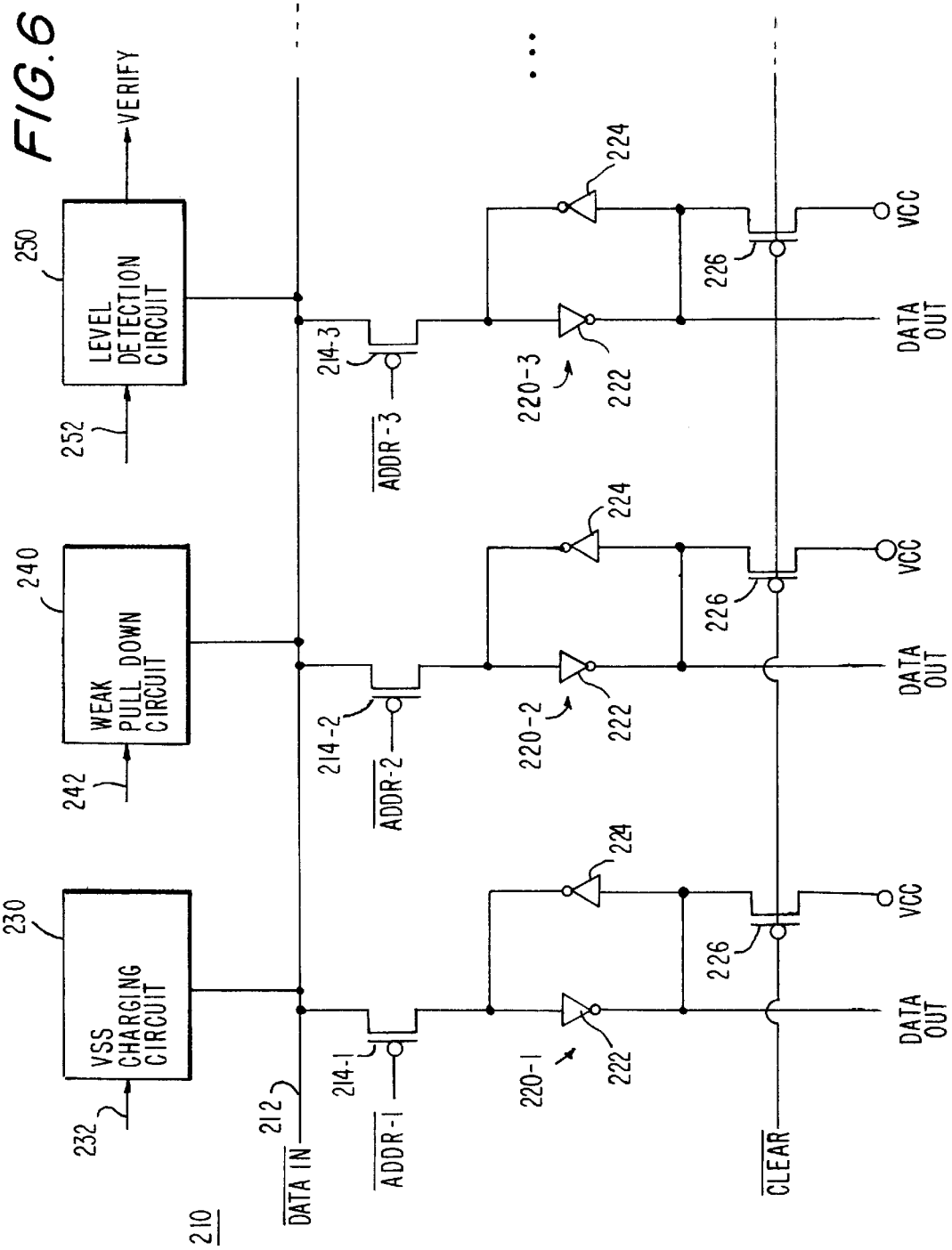
FIG. 6 is a diagram similar to FIG. 4 showing an alternative illustrative embodiment of an SRAM constructed in accordance with the invention.

FIG. 6 shows an alternative embodiment of the FIG. 4 circuitry in which elements 114 and 126 are converted from NMOS pass gates to PMOS pass gates 214 and 226. Other appropriate modifications are also made, but generally similar elements in FIGS. 4 and 6 have their reference numbers increased by 100 in FIG. 6.

To program the FIG. 6 circuitry 210 all SRAM cells 220 are preset to logic 1. This is done by applying logic 0 to the CLEAR bar lead. Thereafter, to switch the SRAM cells 220 that need to be switched to logic 0, logic 1 is applied to DATA IN bar lead 212 and logic 0 is applied to the ADDR bar lead for each SRAM cell that needs to be switched. This turns on the PMOS pass gate 214 receiving that ADDR bar signal, thereby allowing that pass gate 214 to pass logic 1 from lead 212. This in turn switches the DATA OUT of the associated SRAM cell 220 to logic 0. Again, assuming that SRAM circuitry 210 is included on a programmable logic device, the DATA OUT signals of that circuitry can be used in any way that the DATA OUT signals in FIGS. 3 and 4 can be used to control the configuration of the associated programmable logic device.

Verification of the contents of SRAM cells 220 is similar to verification of the contents of SRAM cells 120 except that the polarity is reversed. Thus DATA IN bar lead 212 is first charged to logic 0 by VSS charging circuit 230. Then weak pull down circuit 240 is placed in operation to weakly hold lead 212 at logic 0. Next, logic 0 is applied to the ADDR bar lead of the pass gate 214 associated with the SRAM cell whose content is to be verified. If that SRAM cell is outputting logic 1, the inverter 224 in that cell will be outputting logic 0 and there will be no effect on the logic 0 potential of lead 212 as a result of enabling the pass gate 214 between those elements. Level detection circuit 250 will therefore detect no change in the potential of lead 212, and circuit 250 will accordingly produce a VERIFY output signal which indicates that the SRAM cell 220 being verified is storing logic 1. On the other hand, if the SRAM CELL 220 being verified is outputting logic 0, the inverter 224 in that SRAM cell will be outputting logic 1. This will cause the potential on lead 212 to rise when the pass gate 214 associated with that SRAM cell is enabled. This change in the potential on lead 212 is detected by level detection circuit 250, which consequently produces a VERIFY output signal indicating that the SRAM cell being verified is storing logic 0.

Figure 1:
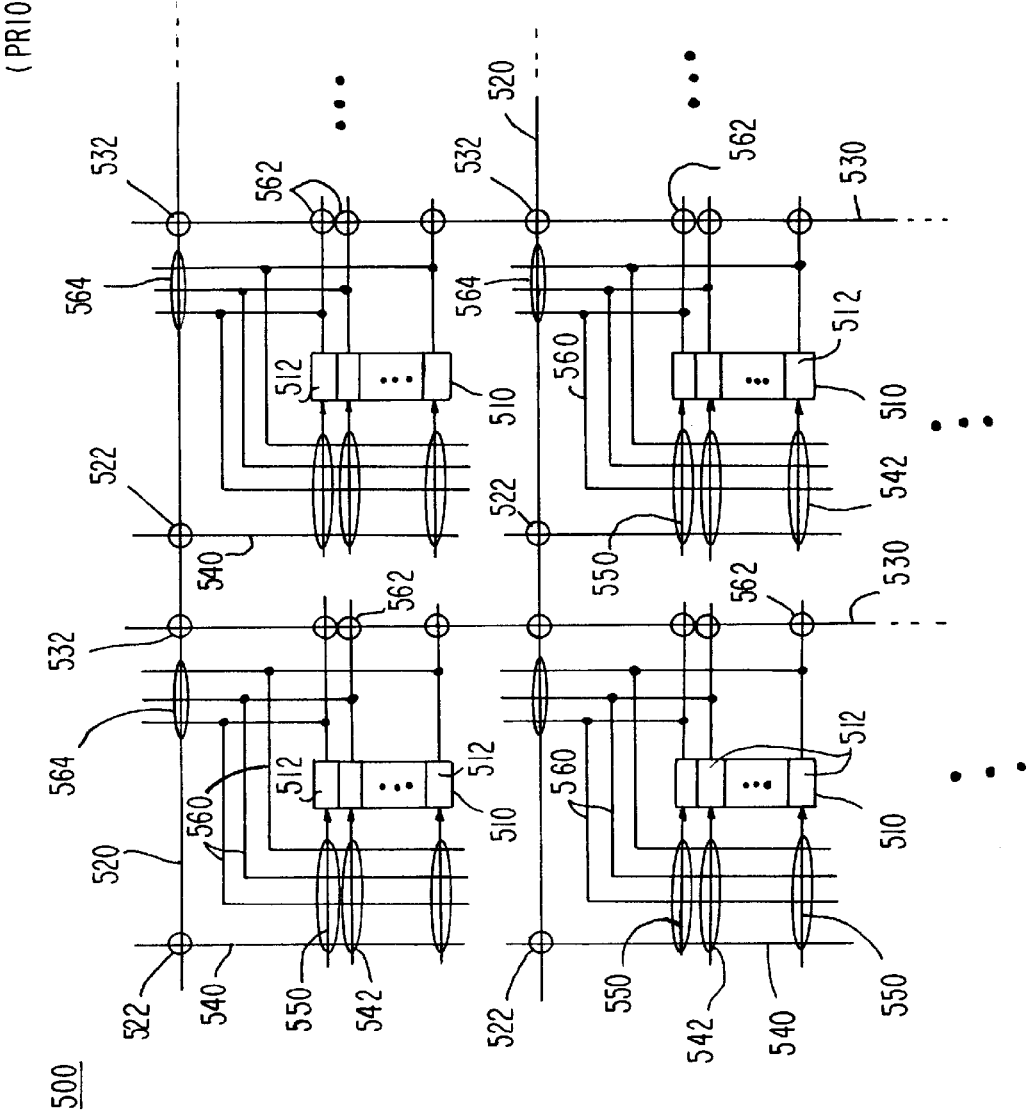
FIG. 1 is a simplified schematic block diagram of a representative portion of illustrative conventional programmable logic device circuitry with which this invention can be used.
Figure 2:
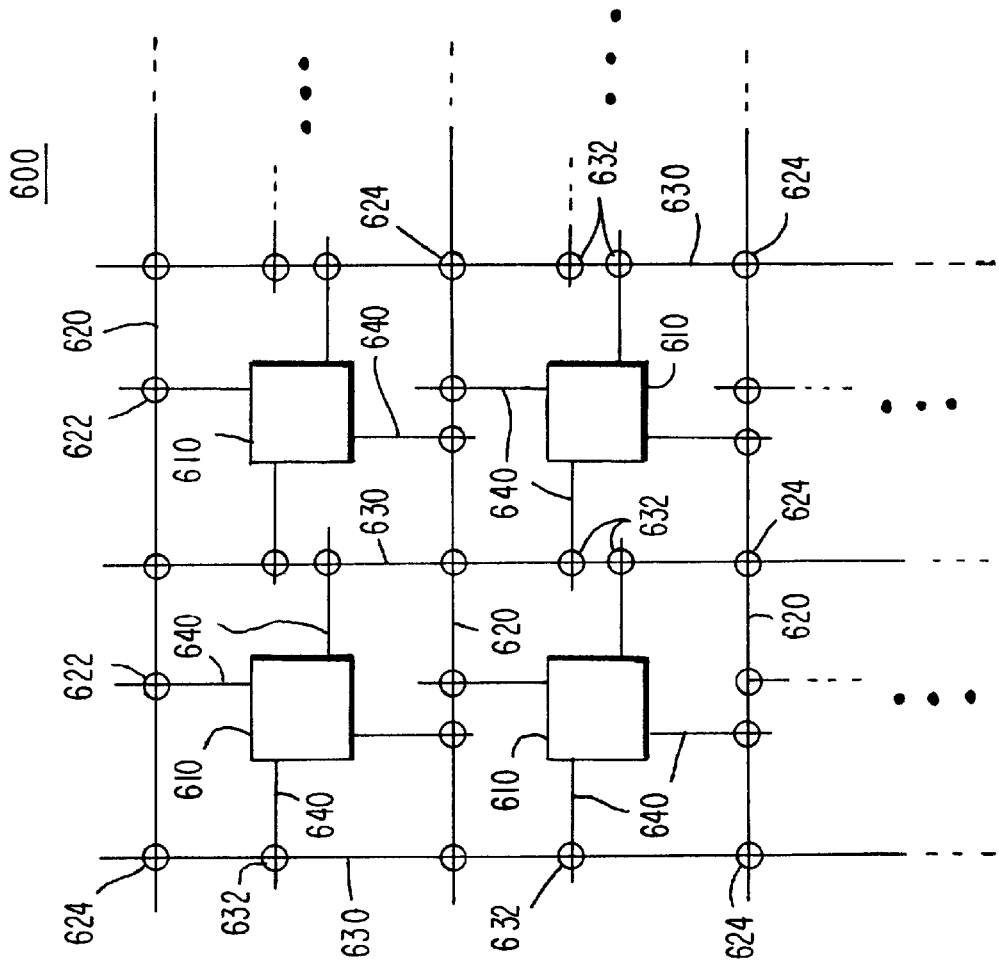
FIG. 2 is similar to FIG. 1, but for another example of conventional programmable logic device circuitry with which the invention can be used.

FIG. 7 illustrates a programmable logic device 402 (which includes one or more SRAMs 110 or 210 in accordance with this invention for programmable control of the configuration of the programmable logic device) in a data processing system 400. The circuitry of device 402 which is controlled by SRAM(s) 110 or 210 may be organized as shown in FIG. 1 or 2 or in any other desired way. In addition to device 402, data processing system 400 may include one or more of the following components: a processor 404; memory 406; I/O circuitry 408; and peripheral devices 410. These components are coupled together by a system bus 420 and are populated on a circuit board 430 which is contained in an end-user system 440.

System 400 can be used in a wide variety of applications, such as computer networking, data networking, instrumentation, video processing, digital signal processing, or any other application where the advantage of using reprogrammable logic is desirable. Programmable logic device 402 can be used to perform a variety of different logic functions. For example, programmable logic device 402 can be configured as a processor or controller that works in cooperation with processor 404. Programmable logic device 402 may also be used as an arbiter for arbitrating access to a shared resource in system 400. In yet another example, programmable logic device 402 can be configured as an interface between processor 404 and one of the other components in system 400. It should be noted that system 400 is only exemplary, and that the true scope and spirit of the invention should be indicated by the following claims.

It will be understood that the foregoing is only illustrative of the principles of the invention, and that various modifications can be made by those skilled in the art without departing from the scope and spirit of the invention.

What is claimed is:

1. A programmable logic array comprising:
   a plurality of programmable logic blocks;
   a plurality of memory cells; and
   programmable interconnect coupled to the plurality of memory cells, wherein each memory cell in the plurality is electrically connected to a common data line for selectively receiving programming information during initial configuration upon asserting an address line associated with that memory cell, and wherein each memory cell is electrically connected to a predetermined voltage for resetting that memory cell prior to initial configuration upon asserting a clear line.

2. The programmable logic array according to claim 1, wherein all the memory cells in the programmable logic array are reset prior to configuration by a signal on the clear line.

3. The programmable logic array according to claim 1, wherein the common data line is coupled to each memory cell by a first pass transistor associated with that memory cell.

4. The programmable logic array according to claim 3, wherein each memory cell includes a first inverter and a second inverter, and wherein the first inverter and the second inverter are cross-coupled.

5. The programmable logic array according to claim 4, wherein the first pass transistor is coupled to an associated input of the first inverter and an associated output of the second inverter.

6. The programmable logic array according to claim 5, wherein the predetermined voltage is coupled to each memory cell by a second pass transistor associated with that memory cell.

7. The programmable logic array according to claim 6, wherein the second pass transistor is coupled to an associated output of the first inverter and an associated input of the second inverter.

8. A storage device on a programmable logic device comprising:
   a storage circuit;
   an input circuit for connecting a data line to the storage circuit in response to an address signal on a first control line; and
   a clear circuit for connecting a predetermined voltage to the storage circuit in response to a clear signal on a second control line, wherein the storage circuit is coupled between the input circuit and the clear circuit, and wherein the storage circuit is operable to be reset to the predetermined voltage based on the clear signal and to store information received from the data line based on the address signal.

9. The storage device of claim 8, wherein the input circuit is a pass transistor.

10. The storage device of claim 8, wherein the storage circuit stores a logic state representing information on the data line in response to the address signal.

11. The storage device of claim 10, wherein the storage circuit is a pair of cross-coupled inverters.

12. The storage device of claim 8, wherein the clear circuit is a pass transistor.

13. The storage device of claim 8, wherein the predetermined voltage is ground.

14. The storage device of claim 8, wherein the storage device includes a plurality of storage circuits, and wherein the clear signal is a global clear signal that resets all of the storage circuits in the programmable logic device.

15. The storage device of claim 8, further comprising a verification circuit.

16. The storage device of claim 15, wherein the verification circuit includes:
   a first block coupled to the data line and being operable to charge the data line to a precharge voltage;
   a second block coupled to the data line and being operable to hold the precharge voltage on the data line; and a third block coupled to the data line and being configured to verify information stored in the storage circuit in response to the precharge voltage on the data line.

17. The storage device of claim 16, wherein:
the first block is a voltage charging circuit;
the second block is a voltage pull-up circuit; and
the third block is a voltage level detection circuit.

18. A programmable logic device comprising:
an array of programmable interconnects;
an array of configurable logic blocks; and
a plurality of storage devices similar to the storage device defined in claim 8, wherein the plurality of storage devices are coupled to the configurable logic blocks and to the programmable interconnects and are arranged in an array.

19. A memory circuit comprising:
a first n-type transistor having associated source, drain, and gate terminals, wherein the source terminal of the first n-type transistor is connected to a data input terminal, and the gate terminal of the first n-type transistor is connected to an address input;
a first inverter having associated input and output terminals, wherein the input terminal of the first inverter is coupled to the drain terminal of the first n-type transistor;
a second inverter having associated input and output terminals, wherein the input terminal of the second inverter is coupled to the output terminal of the first inverter, and the output terminal of the second inverter is coupled to the input terminal of the first inverter; and
a second n-type transistor having associated source, drain, and gate terminals, wherein the source terminal of the second n-type transistor is connected to a first voltage supply, the gate terminal of the second n-type transistor is connected to a reset terminal, and the drain terminal of the second n-type transistor is connected to the output of the first inverter and the input of the second inverter.

20. The memory circuit according to claim 19, wherein the first inverter includes:
a first p-type transistor having source, drain, and gate terminals, wherein the source terminal of the first p-type transistor is connected to a second voltage supply, the gate terminal of the first p-type transistor is connected to the drain terminal of the first n-type transistor, and the drain terminal of the first p-type transistor is connected to a data output terminal; and
a third n-type transistor having source, drain, and gate terminals, wherein the source terminal of the third n-type transistor is connected to the first voltage supply, the gate terminal of the third n-type transistor is connected to the drain terminal of the first n-type transistor, and the drain terminal of the third n-type transistor is connected to the data output terminal.

21. The memory circuit according to claim 20, wherein the second inverter includes:
a second p-type transistor having source, drain, and gate terminals, wherein the source terminal of the second p-type transistor is connected to the second voltage supply, the gate terminal of the second p-type transistor is connected to the data output terminal, and the drain terminal of the second p-type transistor is connected to the drain terminal of the first n-type transistor; and
a fourth n-type transistor having source, drain, and gate terminals, wherein the source terminal of the fourth n-type transistor is connected to the first voltage supply, the gate terminal of the fourth n-type transistor is connected to the data output terminal, and the drain terminal of the fourth n-type transistor is connected to the drain terminal of the first n-type transistor.

22. The memory circuit of claim 21, wherein the first p-type transistor, the second p-type transistor, the third n-type transistor, and the fourth n-type transistor each have associated conductances, wherein the conductance associated with the first p-type transistor is larger than the conductance associated with the second p-type transistor and the conductance associated with the third n-type transistor is larger than the conductance associated with the fourth n-type transistor.

23. A storage device comprising:
a verification circuit;
a bus coupled to the verification circuit and configured to transmit data;
a plurality of memory circuits connected to the bus, wherein each of the plurality of memory circuits includes an address input, a data input, and a data output; and
a plurality of reset circuits coupled to the plurality of memory circuits and configured to initialize the plurality of memory circuits.

24. The storage device of claim 23, further comprising:
a plurality of programmable logic circuits coupled to the plurality of memory circuits, wherein the plurality of programmable logic circuits are arranged in multiple dimensions.

25. The storage device of claim 24, wherein the plurality of memory circuits are configured to selectively program the programmable logic circuits.

26. The storage device of claim 23, wherein the verification circuit includes a charging circuit, a pull-up circuit, and a detection circuit.

27. The storage device of claim 26, wherein the charging circuit is configured to drive the bus to a high voltage potential.

28. The storage device of claim 27, wherein the pull-up circuit is configured to maintain the high voltage potential on the bus.

29. The storage device of claim 28, wherein the detection circuit is configured to detect changes in the high voltage potential on the bus.

30. The storage device of claim 23, wherein each of the plurality of memory circuits includes:
an address component connected to the bus and configured to receive at least one address signal from the address input; and
a memory cell coupled to the address component, wherein the memory cell is configured to store data, and wherein the memory cell is further configured to supply an output signal to the data output.

31. The storage device of claim 30, wherein the memory cell includes a first transistor and a second transistor, and wherein the first transistor has a different driving capability than the second transistor.

32. The storage device of claim 23, wherein each of the plurality of reset circuits includes a reset transistor that is configured to force a logic value to be stored in the memory cell associated with the memory circuit coupled to that reset circuit.

33. An apparatus for storing information in a plurality of memory cells comprising:
means for initializing the plurality of memory cells in response to a reset signal;

means for receiving information with the plurality of memory cells over a data bus associated with the plurality of memory cells in response to address signals applied on an address bus, wherein each memory cell in the plurality of memory cells is coupled to the data bus; and means for selectively storing the information in the memory cells in response to the address signals.

34. The apparatus of claim 33, further comprising means for verifying information stored in the memory cells.

35. The method of claim 34, wherein the means for verifying information includes:

means for logically disconnecting the memory cells from the data bus;

means for charging the data bus to a voltage level that is a predefined potential representing one of two logic states;

means for maintaining the predefined potential on the data bus;

means for detecting a change in the voltage level of the data bus in response to the address signals; and means for confirming the information stored in each memory cell in response to the voltage level on the data bus and the address signal associated with the memory cell being verified.

36. A method for storing information in a plurality of memory cells comprising:

initializing the plurality of memory cells in response to a reset signal;

receiving information transmitted through a data bus associated with the plurality of memory cells in response to address signals over an address bus, wherein each memory cell in the plurality of memory cells is coupled to the data bus; and selectively updating data contained in the memory cells in response to the address signals and the information to be stored.

37. The method of claim 36, further comprising verifying information stored in the memory cells.

38. The method of claim 37, wherein the verifying of the information includes:

logically disconnecting the memory cells from the data bus;

charging the data bus to a voltage level that is a predefined voltage potential representing one of two logic states;

maintaining the predefined voltage potential on the data bus;

detecting a change in the voltage level on the data bus in response to the address signals; and confirming the information stored in each memory cell in response to the voltage level on the data bus and the address signal associated with the memory cell being verified.

* * * * *